United States Patent
Tasaka (10) Patent No.: US 6,259,143 B1
(45) Date of Patent: Jul. 10, 2001

(54) SEMICONDUCTOR MEMORY DEVICE OF NOR TYPE MASK ROM AND MANUFACTURING METHOD OF THE SAME

(75) Inventor: Kazuhiro Tasaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/414,601

(22) Filed: Oct. 8, 1999

(30) Foreign Application Priority Data

Oct. 8, 1998 (JP) .................................................. 10-287021

(51) Int. Cl.⁷ ..................................................... H01L 29/72
(52) U.S. Cl. ........................... 257/390; 257/391; 438/151; 438/225; 438/694
(58) Field of Search ..................................... 257/390, 391; 438/151, 225, 694

(56) References Cited

U.S. PATENT DOCUMENTS 5,962,900 * 10/1999 Chou et al. ............................ 257/390

FOREIGN PATENT DOCUMENTS

| | | |
|---|---|---|
| 2-150063 | 6/1990 | (JP) . |
| 3217054 | 9/1991 | (JP) . |
| 430556 | 2/1992 | (JP) . |
| 574929 | 3/1993 | (JP) . |
| 5-259410 | 10/1993 | (JP) . |
| 5343416 | 12/1993 | (JP) . |
| 8340054 | 12/1996 | (JP) . |
| 1041411 | 2/1998 | (JP) . |

* cited by examiner

Primary Examiner—Edward Wojciechowicz
(74) Attorney, Agent, or Firm—Young & Thompson

(57) ABSTRACT

A NOR type mask ROM has embedded digit lines arranged in stripes sandwiching an active region on a semiconductor substrate, a gate insulating film formed on the surface of the semiconductor substrate, and word lines formed in stripes in a direction perpendicular to the embedded digit lines on the gate insulating film. The embedded digit line is composed of a first groove provided in the surface side region of the semiconductor substrate, a second groove provided at the substrate lower side of the first groove, an insulating film provided on an inner surface of the second groove, and a semiconductor layer doped with an impurity of other conductive type embedded in the first groove and second groove. An impurity diffusion layer of other conductive type functioning as the source and drain is formed by diffusing the impurity contained in the semiconductor layer through the side of the first groove in the active region. Accordingly, in the NOR type mask ROM, lowering of the resistance of the embedded digit lines, and reduction of the junction capacity between the embedded digit lines and substrate are both realized, and the reading speed of the memory cell can be enhanced.

9 Claims, 8 Drawing Sheets

SEMICONDUCTOR MEMORY DEVICE OF NOR TYPE MASK ROM AND MANUFACTURING METHOD OF THE SAME

BACKGROUND OF THE INVENTION

1. Field of the Invention

The present invention relates to a semiconductor memory device of NOR type mask ROM, and more particularly to a semiconductor memory device realizing high speed access and high degree of integration, and a method of manufacturing the same.

2. Related art

Figure 1:
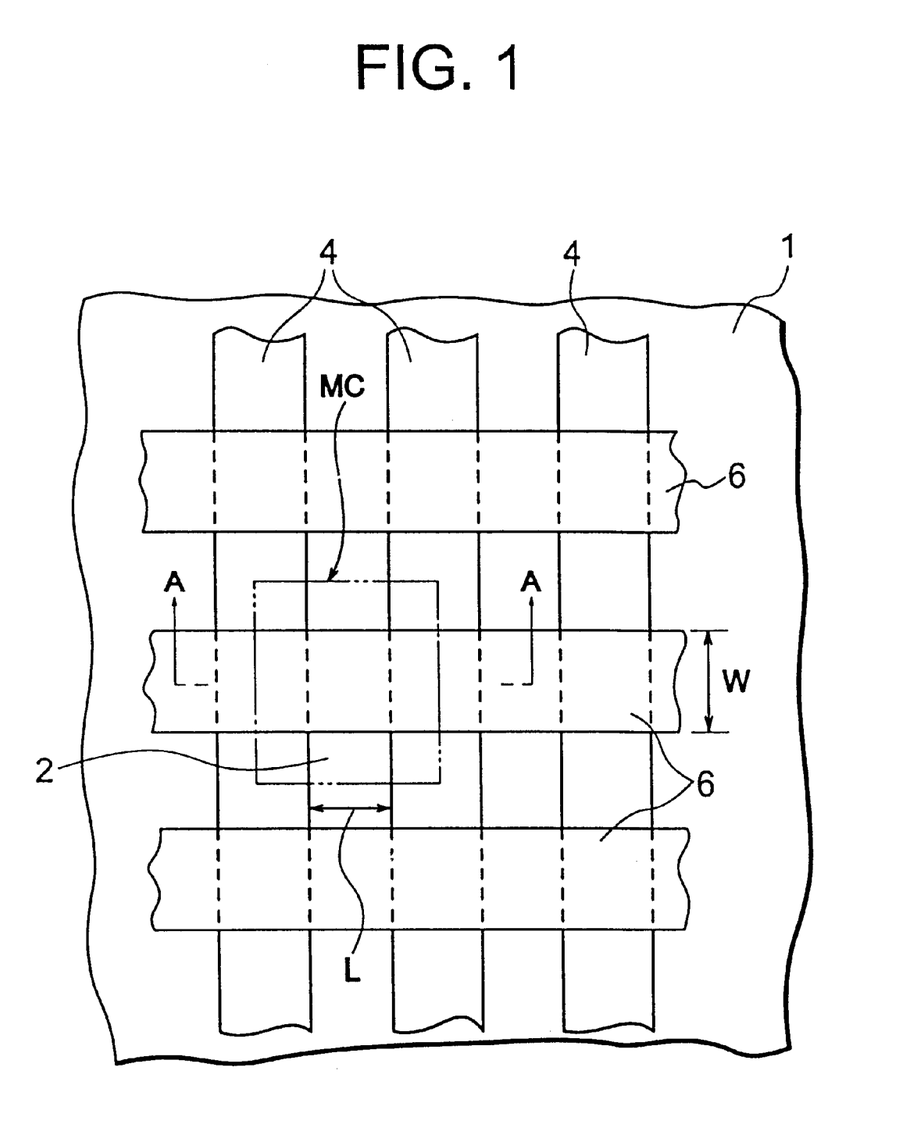
FIG. 1 is a plan view showing a wiring pattern of a general NOR type mask ROM to which the invention is applied.

FIG. 1 is a plan view showing an example of wiring pattern of a general flat NOR type mask ROM. That is, FIG. 1 is a plan view of a general cell layout of NOR type mask ROM having embedded digit lines. In a semiconductor substrate 1, a plurality of embedded digit lines 4 are arranged in stripes alternately with active regions 2. On the surface of the semiconductor substrate 1, moreover, a plurality of word lines 6 are arranged in stripes so as to cross perpendicularly with the embedded digit lines 4. The intersecting region of the active region 2 between the embedded digit lines 4 and the word lines 6, that is, the region enclosed by double dot chain lines in FIG. 1 corresponds to a unit memory cell MC. Herein, L refers to the channel length, and the W is the channel width. In this NOR type mask ROM, by implanting impurity ions of the same conductive type as the semiconductor substrate 1 selectively in the region of memory cell MC, the threshold value of the transistor of the memory cell MC can be changed, so that the data can be written in.

Figure 2A:
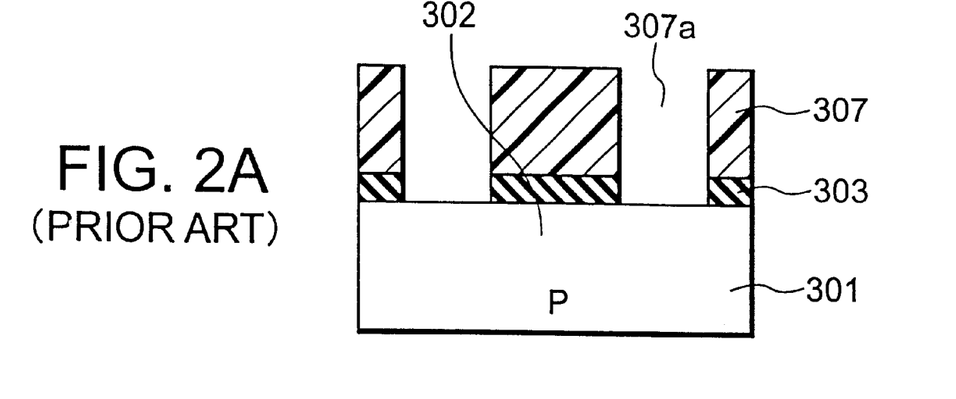
FIGS. 2A to 2D are sectional views showing a conventional manufacturing method of NOR type mask ROM in the sequence of steps.

A conventional manufacturing method of the NOR type mask ROM shown in FIG. 1 will be explained below by referring to FIGS. 2A to 2D. FIGS. 2A to 2D are sectional views along line A—A in FIG. 1. First, as shown in FIG. 2A, an oxide film 303 is formed on a P type silicon substrate 301 (semiconductor substrate 1 in FIG. 1), and a photoresist film 307 is formed thereon, and further the photoresist film 307 is selectively removed from the region which becomes an embedded digit line 304 (digit line 4) in a later process, that is, the region sandwiching the active region 302, so that openings 307a are formed in stripes at specified intervals in the photoresist film 307.

Figure 2B:
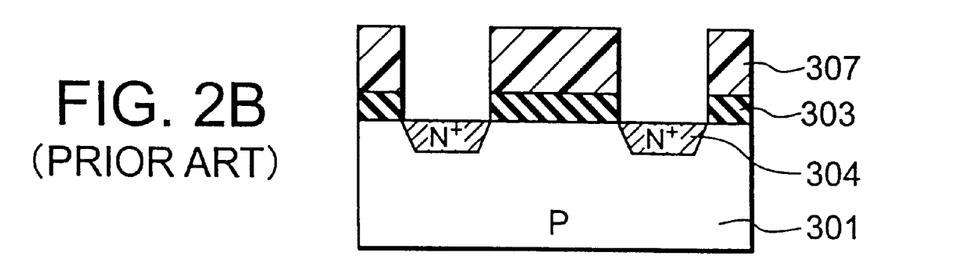

Next, as shown in FIG. 2B, using the photo resist film 307 as mask, for example, arsenic is implanted as N type impurity in the P type silicon substrate 301, and embedded digit lines 304 are formed.

Figure 2C:
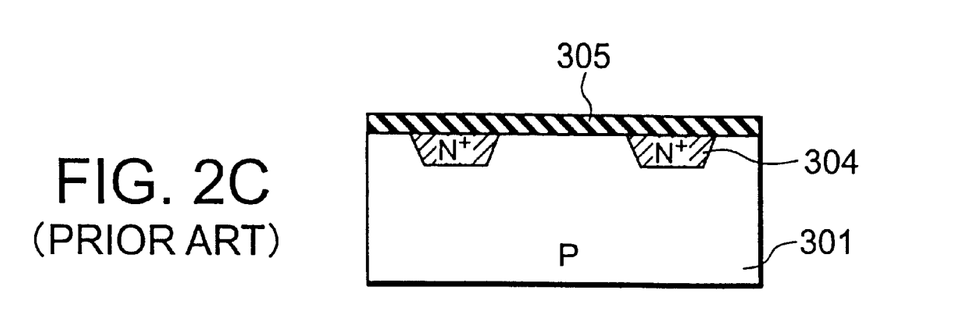

Then, after removing the photo resist film 307 and oxide film 303 consecutively, as shown in FIG. 2C, the surface of the P type silicon substrate 301 is oxidized, and a gate oxide film 305 made of silicon oxide film is formed on the surface of the P type silicon substrate 301.

Figure 2D:
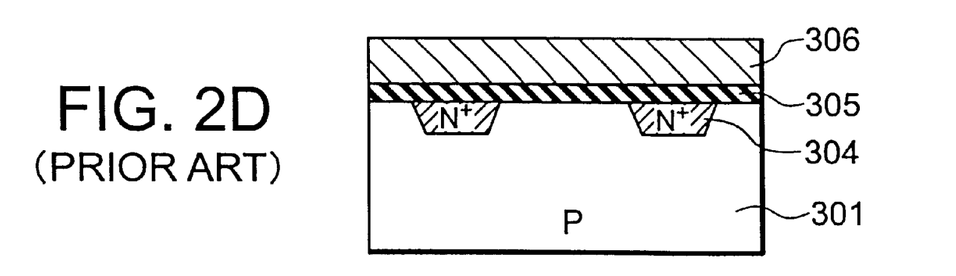

Consequently, as shown in FIG. 2D, a polycrystalline silicon film is formed on the entire surface, and later, although not shown, the polycrystalline silicon film is selectively removed by the selective etching technology using the photo resist film, and stripes of word lines 306 (word lines 6 in FIG. 1) are formed perpendicular to the embedded digit lines 304.

In such conventional NOR type mask ROM, in order to enhancing the reading speed of data in the unit memory cells, it is preferred to lower the layer resistance of the embedded digit lines 304. For this purpose, it is essential to implant the N type impurity for forming the embedded digit lines 305 at high density. However, when the embedded digit line 304 is high in concentration, the junction capacity between the embedded digit line 304 and P type silicon substrate 301 increases, and the propagation speed in the embedded digit line 304 is lowered by the junction capacity. At the same time, the parasitic capacity between the embedded digit line 304 and word line 306 increases, and the propagation speed in the word line 306 is lowered.

To solve such problems, it has been proposed in Japanese Patent Application Laid-Open (JP-A) No. 5-259410 to form a groove at a region where an embedded digit line should be formed in the semiconductor substrate, embed the grooves with insulating region, and form impurity layers at the bottom and side wall of the groove to use as embedded digit lines. In this technique, since the embedded digit lines are formed in the bottom and side wall of the grooves, the parasitic capacity between the embedded digit line and word line can be reduced, and lowering of propagation speed in the word line can be prevented. It is, however, difficult to solve the contradictory problems of the lowering of resistance value of the embedded digit line and the lowering of the junction capacity between the embedded digit line and the semiconductor substrate. Yet, in such constituent of embedding the insulating region in the groove, the occupied area of the unit memory cell increases, which is a problem for realizing a high degree of integration.

SUMMARY OF THE INVENTION

It is hence an object of the present invention to provide a semiconductor memory device including a NOR type mask ROM realizing low resistance of embedded digit lines and reduction of junction capacity in the embedded digit lines simultaneously, capable of reading out from the memory cell at high speed, and realizing a high degree of integration, and a method of manufacturing the same.

A semiconductor memory device of NOR type mask ROM according to the present invention comprises: a semiconductor substrate of one conductive type; an active region formed on the surface of said semiconductor substrate; embedded digit lines arranged in stripes at positions sandwiching said active region; a gate insulating film formed on the surface of said semiconductor substrate; word lines formed in stripes extended in a direction perpendicular to said embedded digit lines on said gate insulating film; and a diffusion layer of other conductive type formed by diffusion of the impurity contained in said semiconductor layer through the side surface of said first groove in said active region. Each of said embedded digit lines are composed of a first groove provided in the surface side region of said semiconductor substrate, a second groove provided at the substrate lower side of said first groove, an insulating film provided on an inner surface of said second groove, and a semiconductor layer doped with impurity of other conductive type embedded in said first groove and second groove.

A manufacturing method of a semiconductor memory device according to the present invention comprises the steps of: forming a first groove in stripe in a region where an embedded digit line should be formed on the surface of a semiconductor substrate; forming a side wall on an inner surface of said first groove; forming a second groove at the lower side of said first groove by using said side wall as a mask; forming an insulating film on an inner surface of said second groove; removing said side wall; embedding a semiconductor layer doped with impurity of other conductive type in said first and second grooves; forming a gate insulating film on the surface of said semiconductor substrate; forming word lines in stripes perpendicular to said embedded digit lines on said gate insulating film; and diffusing said impurity of the other conductive type in said semiconductor layer through the side surface of said first groove.

In the semiconductor memory device according to the present invention, since the semiconductor layer for composing the embedded digit lines is not directly bonded to the semiconductor substrate by the presence of the insulating film formed inside of the second groove, if the impurity concentration of the semiconductor layer is raised and the resistance of the embedded digit lines is lowered, the junction capacity between the embedded digit lines and the semiconductor substrate can be kept low. As a result, the reading speed of the memory cell can be enhanced.

DESCRIPTION OF THE PREFERRED EMBODIMENTS

Figure 3:
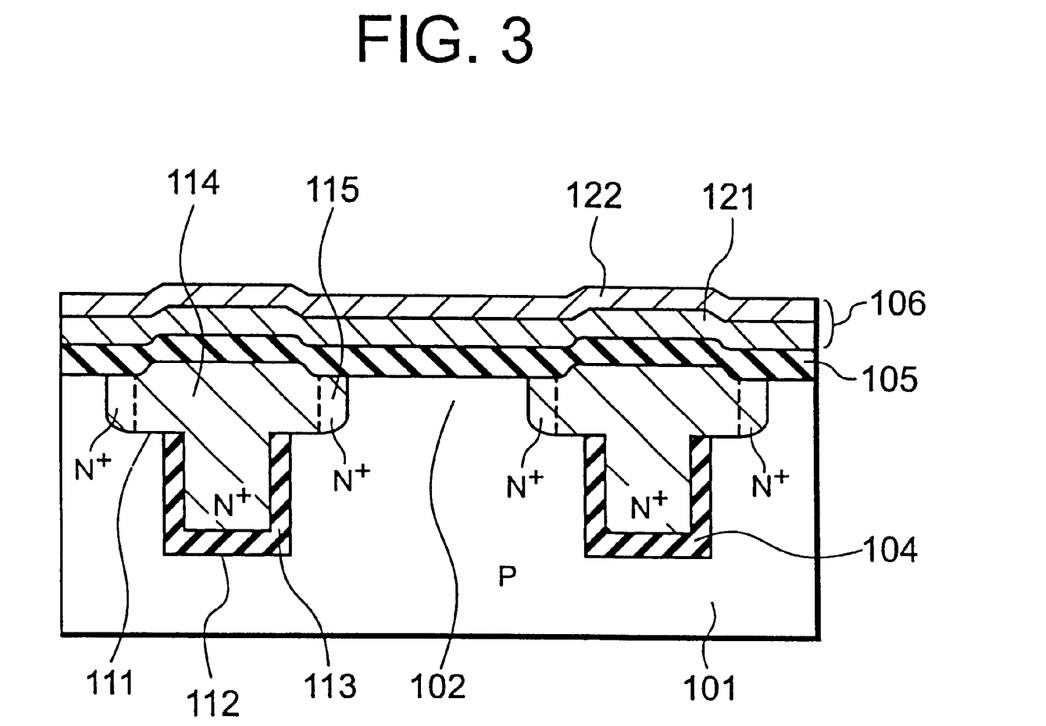
FIG. 3 is a sectional view of a memory cell in a first embodiment of the invention.

Referring now to the accompanying drawings, preferred embodiments of the invention will be described below. FIG. 3 is a sectional view of a NOR type mask ROM in a first embodiment of the invention, and the plan view of this NOR type mask ROM is similar to that of the general NOR type mask ROM shown in FIG. 1. FIG. 3 shows a sectional view of the position corresponding to line AA in FIG. 1. As shown in FIG. 3, in a P type silicon substrate 101 (silicon substrate 1 in FIG. 1), embedded digit lines 104 are provided and arranged in stripes at specified intervals. An active region 102 (active region 2 in FIG. 1) is provided between the embedded digit lines 104. The embedded digit line 104 is composed of a first groove 111 provided perpendicular to the surface of the silicon substrate 101, a second groove 112 formed in a narrower width than the first groove 111, a silicon oxide film 113 formed on the inner surface of the second groove 112, and an amorphous silicon layer 114 doped with N type impurity at a high concentration and completely embedded in the first groove 111 and second groove 112. At both sides of the first groove 111, N type diffusion layers 115 with N type impurity diffused from the amorphous silicon layer 114 toward the active region 102 are formed. On the surface of the P type silicon substrate 101 and embedded digit lines 104, a gate oxide film 105 composed of silicon oxide film is formed. On the surface of this gate oxide film 105, word lines 106 (word lines 6 in FIG. 1) composed of polycrystalline silicon film 121 and tungsten silicide film 122 are formed in stripes extending in a direction perpendicular to the embedded digit lines 104.

A manufacturing method of the NOR type mask ROM of the first embodiment of the invention shown in FIG. 3 is explained below by referring to FIGS. 4A to 4H. First, as shown in FIG. 4A, a silicon oxide film 103 is formed on the P type silicon substrate 101 by thermal oxidation in a thickness of 0.1 to 0.3 µm, and a photo resist film 107 is formed thereon, and the photo resist film in the region sandwiching the active region 102, that is, the region for forming the embedded digit lines is selectively removed, and a mask having an opening 107a is formed.

Figure 4A:
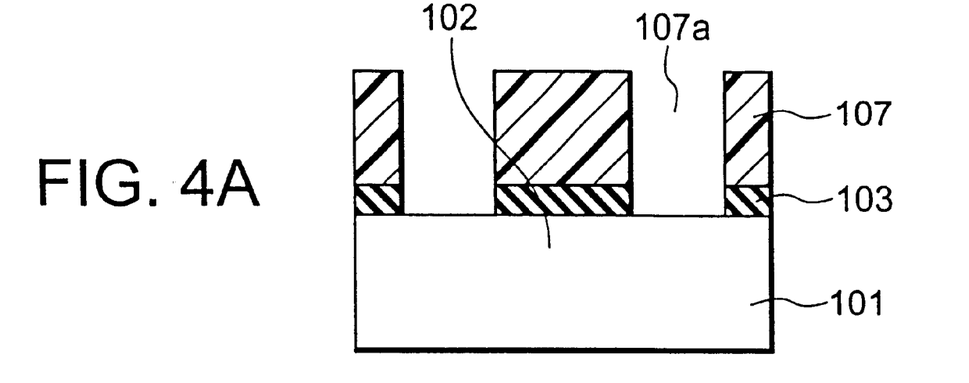
FIGS. 4A to 4H are sectional views showing a manufacturing method of memory cell of the first embodiment in the sequence of steps.

Then, as shown in FIG. 4A, using the photo resist film 107 as mask, the silicon oxide film 103 is removed by etching.

Figure 4B:
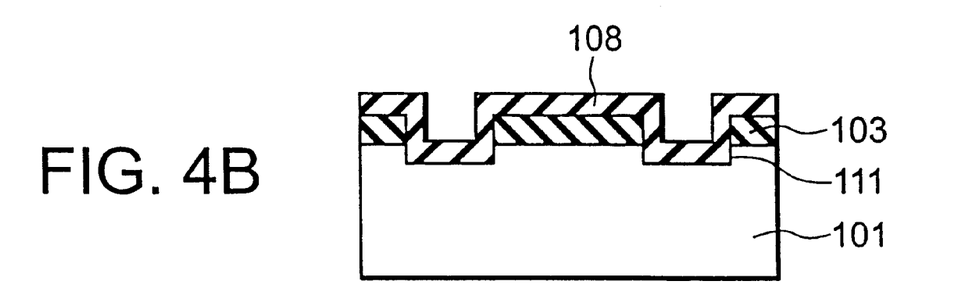

As shown in FIG. 4B, consequently, using the photo resist film 107 as mask, by dry etching of the P type silicon substrate 101, a first groove 111 of 0.2 to 0.5 µm in width and 0.1 to 0.3 µm in depth is formed perpendicular to the surface of the silicon substrate 101. Then, after removing the photo resist film 107, a silicon nitride film 108 is formed on the entire surface of the P type silicon substrate 101 in a thickness smaller than the depth of the first grooves 111 (the depth from the surface of the silicon oxide film 103 to the bottom of the groove 111).

Figure 4C:
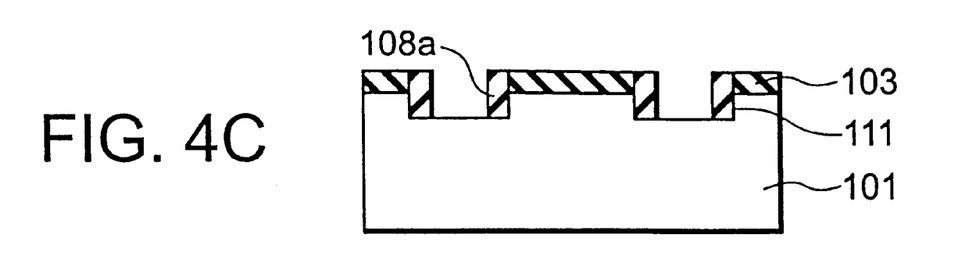

Next, as shown in FIG. 4C, etching back the silicon nitride film 108, a side wall 108a is formed at the side of the first groove 111.

Figure 4D:
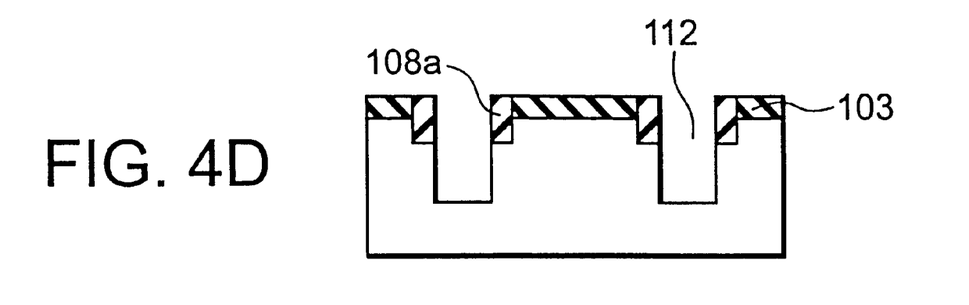

As shown in FIG. 4D, further etching the silicon substrate 101 by using the silicon oxide film 103 and side wall 108a as a mask, a second groove 112 is formed in a depth of 0.1 to 0.3 µm.

Figure 4E:
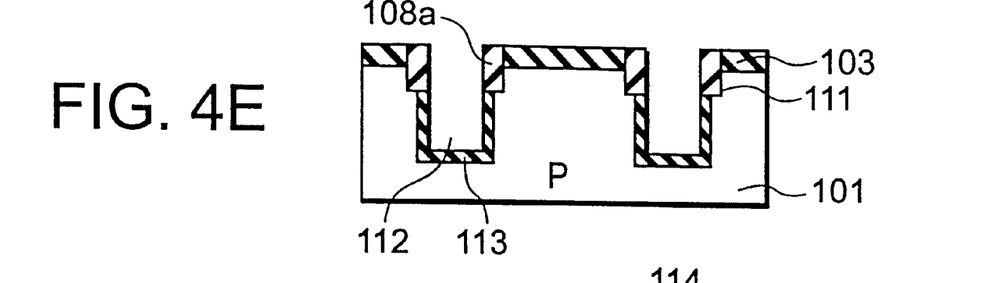

As shown in FIG. 4E, by thermal oxidation of the inside of the second groove 112, a thin silicon oxide film 113 is formed.

Figure 4F:
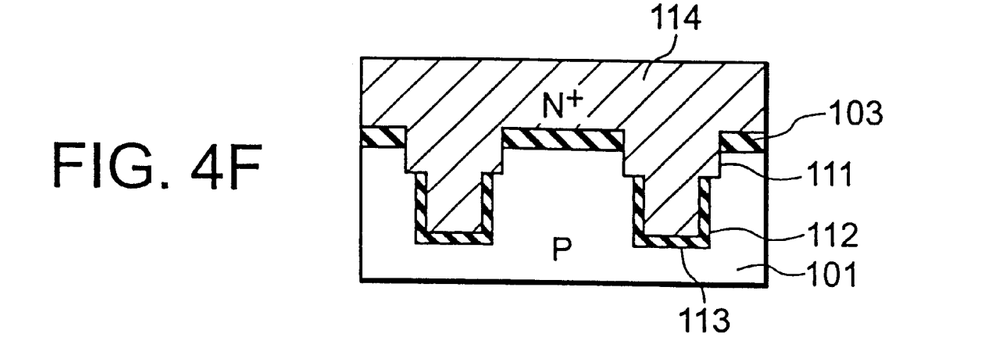

As shown in FIG. 4F, after removing only the side wall 108a by wet etching, an amorphous silicon layer 114 doped with an N type impurity at high concentration is grown on the entire surface so as to bury completely the first groove 111 and second groove 112. After this growth, the surface of the amorphous silicon layer 114 is polished until flat.

Figure 4G:
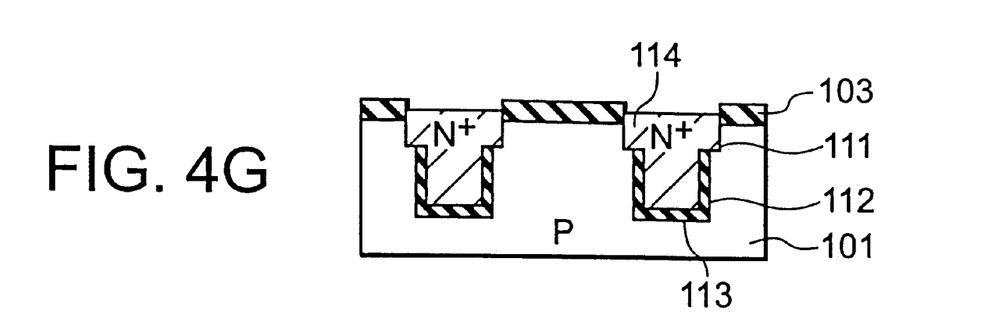

As shown in FIG. 4G, etching back the amorphous silicon layer 114 by dry etching using the silicon oxide film 103 as stopper, the amorphous silicon layer 114 is left over only in the first groove 111 and second groove 112.

Figure 4H:
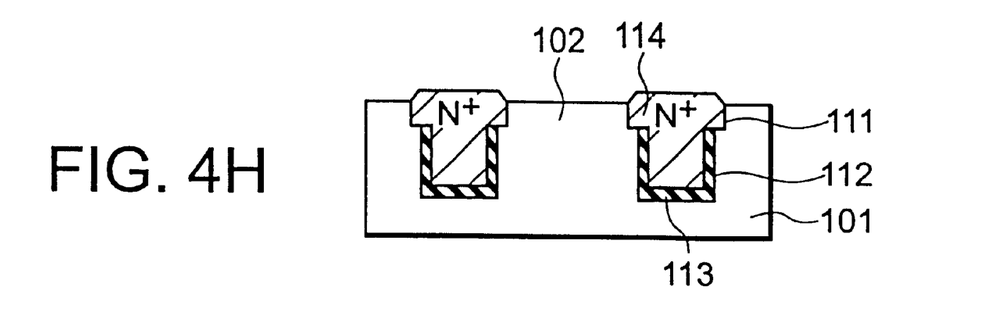

Then, as shown in FIG. 4H, removing the silicon oxide film 103, the surface of the silicon substrate 101 is exposed in the area which should be active region 102.

Later, as shown in FIG. 3, by thermal oxidation of the surface of the silicon substrate 101 and the surface of the amorphous silicon layer 114, a gate oxide film 105 made of silicon oxide film is formed on the entire surface. On the gate oxide film 105, moreover, a polycrystalline silicon film 121 and a tungsten silicide film 122 are laminated to form a polycide structure, and this polycide structure is selectively etched in stripes in the direction perpendicular to the embedded digit lines 104 to form word lines 106 (word lines 6 in FIG. 1). By heat treatment, the N type impurity contained in the amorphous silicon layer 114 is diffused from both sides of the first groove 111 to the active region to form an N type diffusion layer 115, The N type diffusion layer 115 functions as the source and drain of the transistor for composing the memory cell MC.

Thus constituted NOR type mask ROM of the first embodiment is exactly same as the existing NOR type mask ROM in data storing and reading operation, and its description is omitted. On the other hand, in the NOR type mask ROM of the embodiment, the N type amorphous silicon layer 114 for the embedded digit lines 104 is not directly bonded to the silicon substrate 101 due to the presence of the silicon oxide film 113 formed inside of the second groove 112, and if the impurity concentration of the amorphous silicon layer 114 is heightened and the resistance of the embedded digit lines 104 is lowered, the junction capacity between the embedded digit lines 104 and the silicon substrate 101 can be kept low. As a result, the reading speed of the memory cell MC can be enhanced. As for the word lines 106, since the polycide structure is employed, it is possible to lower the resistance, and if there is a parasitic capacity in relation to the embedded digit lines 104, lowering of propagation speed in the word lines 106 can be suppressed.

Figure 5:
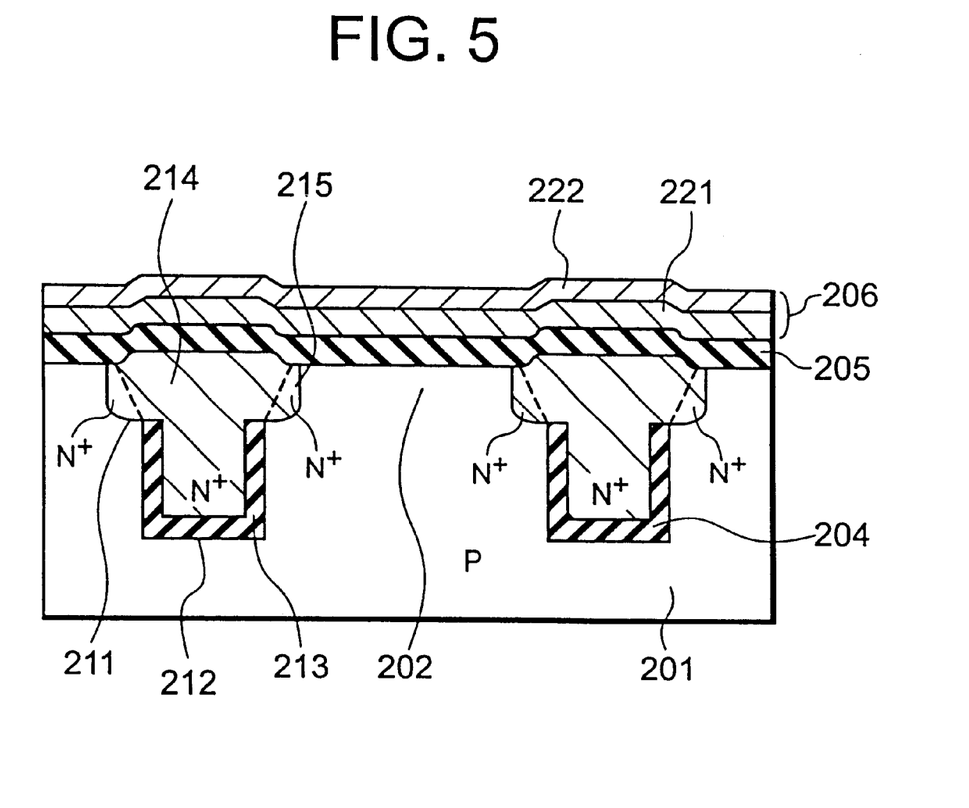
FIG. 5 is a sectional view of a memory cell in a second embodiment of the invention.

FIG. 5 is a sectional view of a second embodiment of the invention, showing, same as FIG. 3, a sectional view corresponding to line AA in FIG. 1. As shown in FIG. 5, in a P type silicon substrate 201 (silicon substrate 1 in FIG. 1), embedded digit lines 204 (embedded digit lines 4) arranged in stripes at specified intervals are provided so as to sandwich an active region 202 (active region 2 in FIG. 1). The embedded digit line 204 is composed of a first groove 211 formed obliquely in a thickness direction of the silicon substrate 201, a second groove 212 formed perpendicular to the surface of the silicon substrate 201 in a narrower width than the first groove 211, a silicon oxide film 213 formed on the inner surface of the second groove 212, and an amorphous silicon layer 214 doped with N type impurity at a high concentration and completely embedded in the first groove 211 and second groove 212.

At both sides of the first groove 211, N type diffusion layers 215 with N type impurity diffused from the amorphous silicon layer 214 toward the active region 202 are formed. On the surface of the P type silicon substrate 201 and embedded digit lines 204, a gate oxide film 205 made of silicon oxide film is formed, and on the surface of this gate oxide film 205, word lines 206 composed of polycrystalline silicon film 221 and tungsten silicide film 222 are formed in stripes extending in a direction perpendicular to the embedded digit lines 204.

Figure 6A:
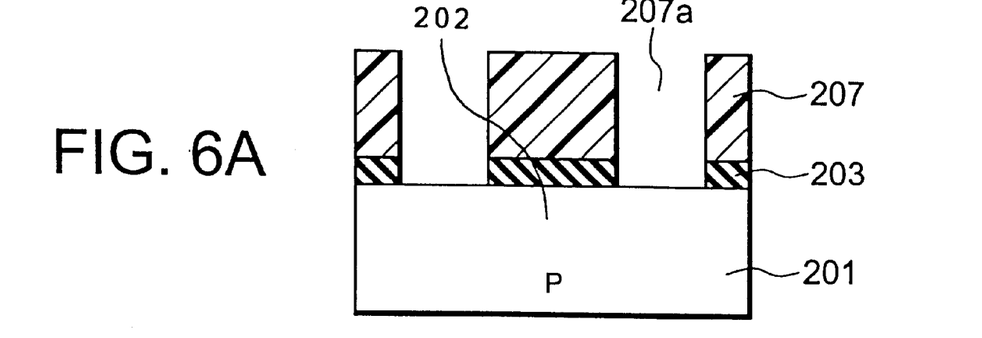
FIGS. 6A to 6H are sectional views showing a manufacturing method of memory cell of the second embodiment in the sequence of steps.

A manufacturing method of the NOR type mask ROM of the second embodiment of the invention shown in FIG. 5 is explained below by referring to FIGS. 6A to 6H. First, as shown in FIG. 6A, a silicon oxide film 203 is formed on a P type silicon substrate 201 by thermal oxidation in a thickness of 0.1 to 0.3 µm, and a photo resist film 207 is formed thereon to provide a mask having an opening 207a on a region of embedded digit lines sandwiching the active region 202.

Figure 6B:
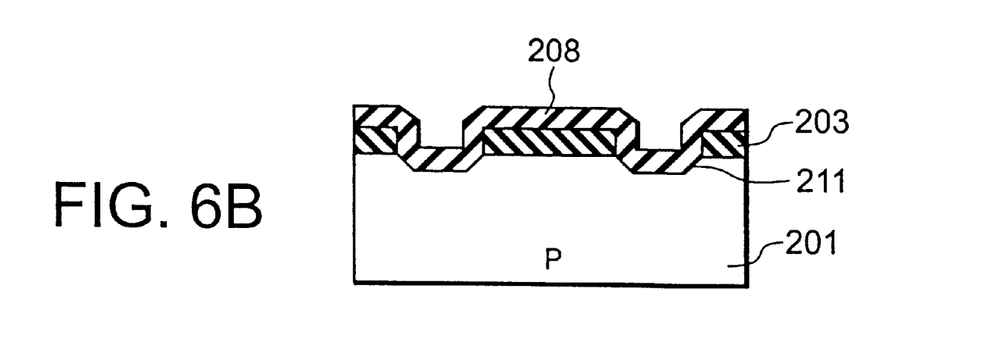

Then, as shown in FIG. 6B, using the photo resist film 207 as mask, the silicon oxide film 203 is removed by etching, and further by wet etching of the P type silicon substrate 201, a first groove 211 is formed in the surface of the silicon substrate 201 in a taper form of 0.2 to 0.5 µm in width and 0.1 to 0.3 µm in depth.

Then, after removing the photo resist film 207, a silicon nitride film 208 is formed on the entire surface of the P type silicon substrate 201 in a thickness smaller than the depth of the first groove 211.

Figure 6C:
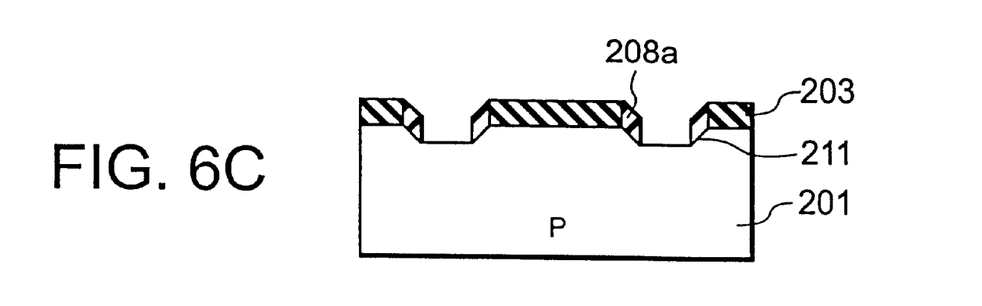

Next, as shown in FIG. 6C, etching back the silicon nitride film 208, a side wall 208a is formed at the side of the first groove 211.

Figure 6D:
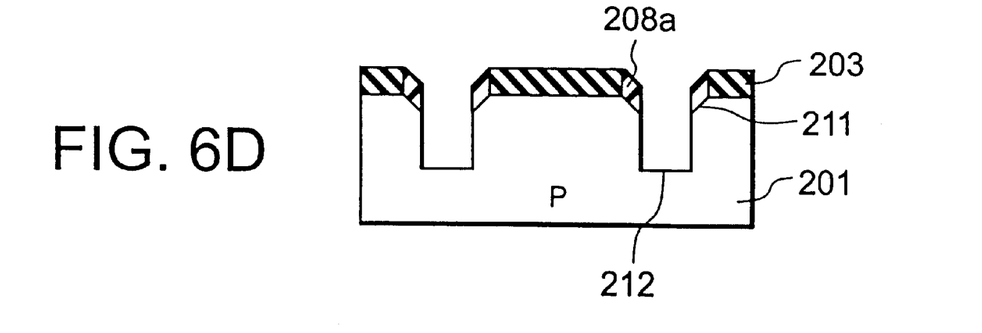

As shown in FIG. 6D, further etching the silicon substrate 201 by using the side wall 208a as mask, a second groove 212 is formed in a depth of 0.1 to 0.3 µm.

Figure 6E:
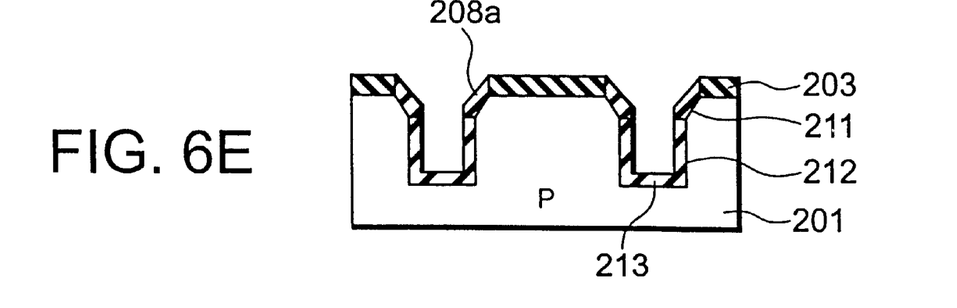

As shown in FIG. 6E, by thermal oxidation of the inner surface of the second groove 212, a thin silicon oxide film 213 is formed.

Figure 6F:
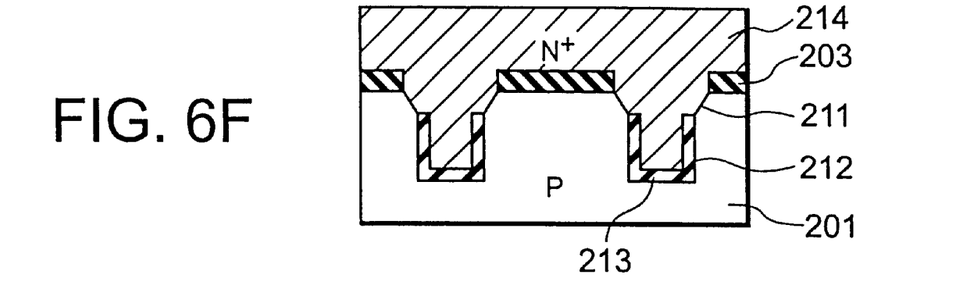

As shown in FIG. 6F, after removing only the side wall 208a by wet etching, an amorphous silicon layer 214 doped with an N type impurity at high concentration is grown on the entire surface so as to bury completely the first groove 211 and second groove 212. After this growth, the surface is polished until flat.

Figure 6G:
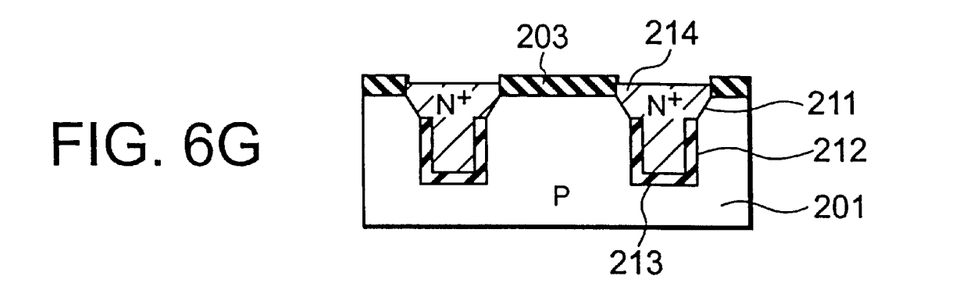

As shown in FIG. 6G, dry etching back the amorphous silicon layer 214 using the silicon oxide film 203 as stopper, the amorphous silicon layer 214 is left over only in the first groove 211 and second groove 212.

Figure 6H:
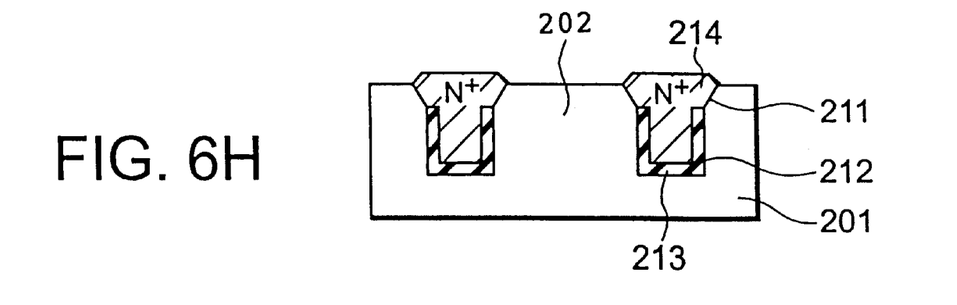

Then, as shown in FIG. 6H, removing the silicon oxide film 203, the surface of the silicon substrate 201 is exposed in the area which should be an active region 202.

Later, as shown in FIG. 5, by thermal oxidation of the surface of the silicon substrate 201 and the surface of the amorphous silicon layer 214, a gate oxide film 205 made of silicon oxide film is formed on the entire surface.

Later, as shown in FIG. 5, on the gate oxide film 205, moreover, a polycrystalline silicon film 221 and a tungsten silicide film 222 are laminated to form a polycide structure. Afterwards, this polycide structure is selectively etched in stripes extended in the direction perpendicular to the embedded digit lines 204 to form word lines 206 (word lines 6 in FIG. 1). By heat treatment, the N type impurity contained in the amorphous silicon layer 214 is diffused from both sides of the first groove 211 to the active region 202 to form the N type diffusion layer 215. It functions as the source and drain of the transistor for composing the memory cell MC.

In thus constituted NOR type mask ROM of the second embodiment, too, since the N type amorphous silicon layer 214 for composing the embedded digit lines 204 is not directly bonded to the silicon substrate 201 due to the presence of the silicon oxide film 213 formed on the inner surface of the second groove 212, if the impurity concentration of the amorphous silicon layer 214 is heightened and the resistance of the embedded digit lines 204 is lowered, the junction capacity between the embedded digit lines 204 and the silicon substrate 201 can be kept low. As a result, the reading speed of the memory cell MC can be enhanced. As for the word lines 206, since the polycide structure is employed, it is possible to lower the resistance. If there is a parasitic capacity between the word lines 206 and the embedded digit lines 204, lowering of propagation speed in the word lines 206 can be suppressed. Further in the second embodiment, since the first groove 211 is in a taper shape, spreading of the N type impurity in the lateral direction can be suppressed more effectively than in the first embodiment, and the diffusion layer 215 may be smaller in size, so that the gate length L in the memory cell MC may be extended. Therefore, the gap of the embedded digit lines 204 can be narrowed by the corresponding portion, and the memory cell is smaller in size, and the memory capacity can be increased.

In the second embodiment, amorphous silicon is used as the semiconductor layer filling up the groove, but single crystalline silicon may be also used. Or polycrystalline silicon may be used, too. In this constitution, the first groove and second groove are divided by concept, but in actual manufacture, however, only one groove may be formed, and an insulating film may be formed on a lower portion of an inner surface of the groove, and the groove may be filled with semiconductor layer.

According to the present invention, in which first and second grooves are formed in a semiconductor substrate, an insulating film is formed on an inner surface of the second groove, the first and second grooves are filled with semiconductor layer, and an impurity is diffused from this semiconductor layer through the side of the first groove to form a diffusion layer functioning as the source and drain, thereby forming a NOR type mask ROM, since the semiconductor layer for composing the embedded digit lines is not directly bonded to the semiconductor substrate by the presence of the insulating film formed inside of the second groove, if the impurity concentration of the semiconductor layer is raised to lower the resistance of the embedded digit lines, the junction capacity between the embedded digit lines and the semiconductor substrate can be kept low. As a result, the reading speed of the memory cell can be enhanced.

What is claimed is:

1. A semiconductor memory device of NOR type mask ROM comprising:

a semiconductor substrate of one conductive type;

an active region formed on the substrate of said semiconductor substrate;

embedded digit lines arranged in stripes at position sandwiching said active region, each of said embedded digit lines being composed of a first groove provided in the surface side region of said semiconductor substrate, a second groove provided at the substrate lower side of said first groove, an insulating film provided on an inner surface of said second groove, and a semiconductor layer doped with impurity of other conductive type embedded in said first groove and second groove;

a gate insulating film formed on the surface of said semiconductor substrate;

word lines formed in stripes extended in a direction perpendicular to said embedded digit lines on said gate insulating film; and a diffusion layer of other conductive type formed by diffusion of the impurity contained in said semiconductor layer through the side surface of said first groove in said active region.

2. A semiconductor memory device according to claim 1, wherein the width of said second groove is narrower than the width of said first groove.

3. A semiconductor memory device according to claim 1, wherein the side surface of said first groove is perpendicular to the surface of said semiconductor substrate.

4. A semiconductor memory device according to claim 1, wherein the side surface of said first groove is in a taper shape inclined to the surface of said semiconductor substrate.

5. A semiconductor memory device according to claim 1, wherein the semiconductor layer embedded in said first groove and second groove is an amorphous silicon layer.

6. A semiconductor memory device according to claim 1, wherein said word lines are polycide structure composed of a refractory metal film and a polycrystalline silicon film.

7. A manufacturing method of a semiconductor memory device comprising the steps of:

forming a first groove in stripe in a region where an embedded digit line should be formed on the surface of a semiconductor substrate;

forming a side wall on an inner surface of said first groove;

forming a second groove at the lower side of said first groove by using said side wall as a mask;

forming an insulating film on an inner surface of said second groove;

removing said side wall;

embedding a semiconductor layer doped with impurity of other conductive type in said first and second grooves;

forming a gate insulating film on the surface of said semiconductor substrate;

forming word lines in stripes perpendicular to said embedded digit lines on said gate insulating film; and diffusing said impurity of the other conductive type in said semiconductor layer through the side surface of said first groove.

8. A manufacturing method of a semiconductor memory device according to claim 7, wherein said side wall is a silicon nitride film, and the insulating film on the inner surface of said second groove is a silicon oxide film.

9. A manufacturing method of a semiconductor memory device according to claim 7, wherein said step of embedding the semiconductor layer in said first groove and second groove is a step of embedding amorphous silicon containing other conductive type impurity and flattening the surface.

* * * * *